United States Patent
Mertol et al.

[11] Patent Number: 6,069,027
[45] Date of Patent: May 30, 2000

[54] FIXTURE FOR LID-ATTACHMENT FOR ENCAPSULATED PACKAGES

[75] Inventors: Atila Mertol, Cupertino; Brent Bacher, Fremont, both of Calif.

[73] Assignee: LSI Logic Corporation, Milpitas, Calif.

[21] Appl. No.: 08/859,751

[22] Filed: May 21, 1997

[51] Int. Cl.[7] .......................... H01L 21/44; H01L 21/48; H01L 21/50

[52] U.S. Cl. .......................... 438/118; 438/106; 438/121; 438/123

[58] Field of Search .................................. 438/118, 106, 438/121, 123

[56] References Cited

U.S. PATENT DOCUMENTS 5,455,456  10/1995  Newman .
5,837,562  11/1998  Cho ......................................... 438/125

*Primary Examiner*—Kevin M. Picardat
*Assistant Examiner*—D. Mark Collins

[57] ABSTRACT

An electronic semiconductor device package, the package having: a substrate having a top and bottom surface and having traces; a die attached to the top surface of the substrate; first level interconnects of the die to the traces of the substrate; encapsulant which covers the die and first level interconnects; and a lid attached to the encapsulant, wherein the lid comprises at least one lid support which extends from the lid to the substrate. A fixture for attaching a lid to an electronic semiconductor device package, the package having: a substrate having a top surface and a bottom surface and having traces, a die attached to the top surface of the substrate, first level interconnects of the die to the traces of the substrate, and the fixture having: an interior opening for receiving the lid and package, wherein the interior opening comprises first and second walls, wherein the first wall of the interior opening corresponds to an outside dimension of the substrate and wherein the second wall corresponds to an outside dimension of the lid. A method of attaching a lid to an electronic semiconductor device package, the package having: a substrate having a top surface and a bottom surface and having traces, a die attached to the top surface of the substrate, first level interconnects of the die to the traces of the substrate, and the method having: inserting a lid into a fixture, wherein the fixture comprises an interior opening for receiving the lid and package wherein the interior opening has a first wall corresponding to a dimension of the substrate and a second wall corresponding to a dimension of the lid; applying adhesive between the lid and package; and inserting a package into the fixture.

6 Claims, 16 Drawing Sheets

FIXTURE FOR LID-ATTACHMENT FOR ENCAPSULATED PACKAGES

TECHNICAL FIELD

This invention relates generally to electronic semiconductor chip packages and more particularly to lid attachment and package curing apparatuses and methods.

BACKGROUND OF THE INVENTION

Electronic semiconductor packages are well-known and are configured in several different ways. Typically, an electronic semiconductor package includes: a silicon chip (die) containing circuit elements; a substrate, for example, a printed circuit board (PCB); first level interconnects which connect the die and the substrate, i.e., wirebonds, Tape Automated Bonds (TAB) and Controlled Collapse Chip Connection (C4 or flip chip bonds); and second level interconnects, such as external metal pins or solder balls, which connect the substrate to printed wiring circuit cards. Substrates comprise ceramic or plastic materials depending on the particular application. Some semiconductor packages have encapsulant which coats the die and the first level interconnects for protection. A dam or stiffener ring may also be used to hold the encapsulant in place around the die and interconnects as it hardens. Finally, a lid covers the top of the package to protect and dissipate heat from the die and first level interconnects.

A cross-sectional view of a typical cavity-up electronic semiconductor package is shown in FIG. 1. A semiconductor chip or die 1 is attached to a substrate 2 by die attach epoxy 1a. The die 1 electrically communicates with the traces 3 of the substrate 2 by bond wires 4. Encapsulant 6 resides over the die 1 and wirebonds 4. A layer of epoxy 7 is spread over the encapsulant 6 and a lid 8 is attached thereto by the epoxy 7. Solder balls 9 attach the substrate 2 to a printed wiring circuit card, not shown.

During operation, energy is lost in the form of heat which builds up in the electronic semiconductor packages. As junction temperatures increase, reliability and speed are sacrificed. Because failure processes accelerate with increased temperature, the life of each junction becomes shorter as the temperature increases. It is generally well-known to provide means for dissipating heat from the electronic semiconductor package. It is particularly important to dissipate heat from electronic packages with semiconductor devices which operate at high speeds and high power levels.

The path of heat dissipation is considered in two parts: junction-to-case path and case-to-ambient path. The junction-to-case path usually conducts heat directly from the die to a package surface through an encapsulant epoxy. Then the heat is convected from the semiconductor package case to a surrounding ambient (case-to-ambient path) either by natural convection or forced convection. The case-to-ambient heat transfer is enhanced by increasing surface area exposed to ambient air. This is accomplished by employing heat sinks which have many configurations. Fluids such as air, water, etc. are passed over the heat sink to exchange heat from the heat sink surface to the fluid or ambient.

Because the heat dissipation effectiveness of a heat dissipation device is dependent on the thermal resistance of the path between the junction and the case, the means of attaching the lid to the die and substrate is critically important. Typically, lids are constructed from a high thermal conductivity material, such as copper, aluminum or high thermal conductivity plastic. They are attached to the packages with thermally conductive adhesive or epoxy, such as "LOCTITE-384" produced by Loctite Corp.

Typically, the lids are attached to packages by hand. A large drop of epoxy is placed on the top of the encapsulant of the glob top package. The lid is then placed on top of the glob top and pressed against the package to squeeze the epoxy between the lid and the encapsulant. The entire package is then placed in an oven for curing.

This process, however, results in misaligned lids and poor conduction paths between the dies and the lids. In the first instance, the lids may be placed on the packages off center and tilted prior to the curing process. Further, as the packages are cured, both the encapsulant of the glob tops and the epoxy between the lids and the glob tops soften and deform which causes the lids to shift. In fact, the lids may be off target, relative to center, by as much as +/−0.050 inches and the lids may not rest flat, relative to the substrate.

Therefore, there is a need for a method and device for attaching lids to packages which does not allow the lids to drift from center or to tilt to one side of the package during the attachment and curing processes.

SUMMARY OF THE INVENTION

In accordance with one embodiment of the invention, there is provided a fixture which ensures proper alignment of the lid and package during attachment and curing processes. The lid and package are placed within the fixture and closed at the top with a top plate. A clamp is used to squeeze the fixture during the curing process to ensure a proper force to generate a strong bond between the glob top and the lid interface and also prevent the package from warpage during the curing process. The clamp and fixture prevent undesirable movement of the lid relative to the package during assembly and curing. The fixture of the present invention ensures lid placement accuracy of less than +/−0.005 inches and proper alignment.

According to an additional aspect of the invention, there is provided an electronic semiconductor device package, the package comprising: a substrate having a top and bottom surface and having traces; a die attached to the top surface of the substrate; first level interconnects of the die to the traces of the substrate; encapsulant which covers the die and first level interconnects; and a lid attached to the encapsulant, wherein the lid comprises at least one lid support which extends from the lid to the substrate.

According to a further aspect of the invention, there is provided a fixture for adhesively attaching a lid to a semiconductor package, wherein the package comprise a semiconductor die attached to an upper surface of a package substrate of the semiconductor package, the lid having a plurality of lid supports attached to its outer perimeter for engaging the upper surface of the package substrate, the fixture comprising: a base member having an upper surface; a first recess formed in the upper surface of the base member, the first recess having a perimeter corresponding to the perimeter of the package substrate and providing a surface for engaging the package substrate; a second recess formed within the first recess, the perimeter of the second recess being greater than the perimeter of the lid to create a channel for the adhesive to flow around the lid supports; a third recess formed within the second recess, the third recess having a perimeter corresponding to the perimeter of the lid and providing a surface for engaging the lid, the depth of the third recess being such that the lid supports of the lid are extendible to the first recess to engage the surface of the package substrate.

According to a still further aspect of the invention, there is provided a fixture for attaching a lid to an electronic semiconductor device package, the package comprising: a substrate having a top surface and a bottom surface and having traces, a die attached to the top surface of the substrate, first level interconnects of the die to the traces of the substrate, and the fixture comprising: an interior opening for receiving the lid and package, wherein the interior opening comprises first and second walls, wherein the first wall of the interior opening corresponds to an outside dimension of the substrate and wherein the second wall corresponds to an outside dimension of the lid.

According to an alternative aspect of the invention, there is provided a method of attaching a lid to an electronic semiconductor device package, the package comprising: a substrate having a top surface and a bottom surface and having traces, a die attached to the top surface of the substrate, first level interconnects of the die to the traces of the substrate, and the method comprising: inserting a lid into a fixture, wherein the fixture comprises an interior opening for receiving the lid and package wherein the interior opening has a first wall corresponding to a dimension of the substrate and a second wall corresponding to a dimension of the lid; applying adhesive between the lid and package; and inserting a package into the fixture.

The fixture of the invention may be employed in connection with any existing or contemplated electronic systems including integrated circuit devices and semiconductor devices with or without packages, multi-chip modules, flip-chip devices, substrate structures and other forms of electronic component devices and systems that require lids or similar structural attachments for either thermal improvement or warpage control.

BRIEF DESCRIPTION OF THE DRAWINGS

The present invention is better understood by reading the following description of nonlimitative embodiments, with reference to the attached drawings wherein like parts in each of the several figures are identified by the same reference character, and which are briefly described as follows.

DETAILED DESCRIPTION OF THE INVENTION

Figure 2A:
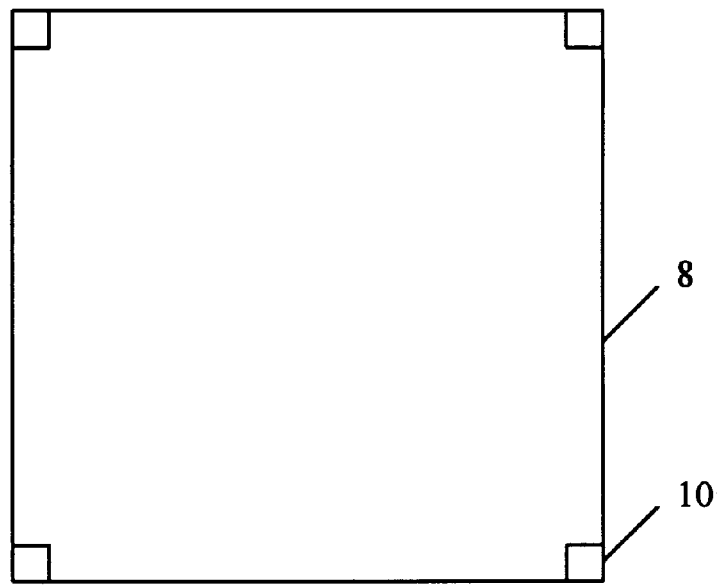
FIG. 2A is a top view of a lid having lid supports.
Figure 2B:
FIG. 2B is a side view of the lid shown in FIG. 2A.
Figure 2C:
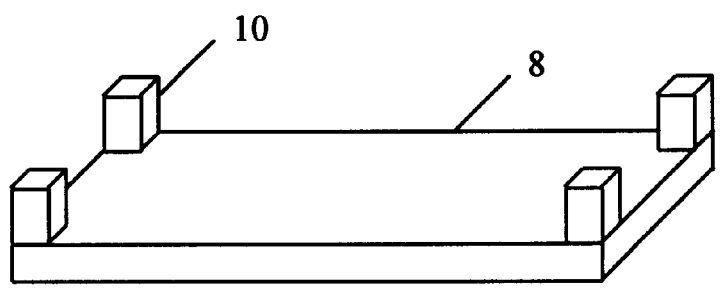
FIG. 2C is a perspective view of the lid shown in FIGS. 2A and 2B.

Referring to FIGS. 2A through 2C, a lid of the present invention is disclosed. The lid 8 is flat and rectangularly shaped. At each of the four corners, the lid 8 has a lid support 10. The lid supports 10 extend perpendicularly from a side of the lid 8 which is intended for attachment to a package. In alternative embodiments, the lid is disc shaped or shaped similar to the package to which it is to be attached. Further any number of lid supports are placed anywhere on the lid.

Figure 1:
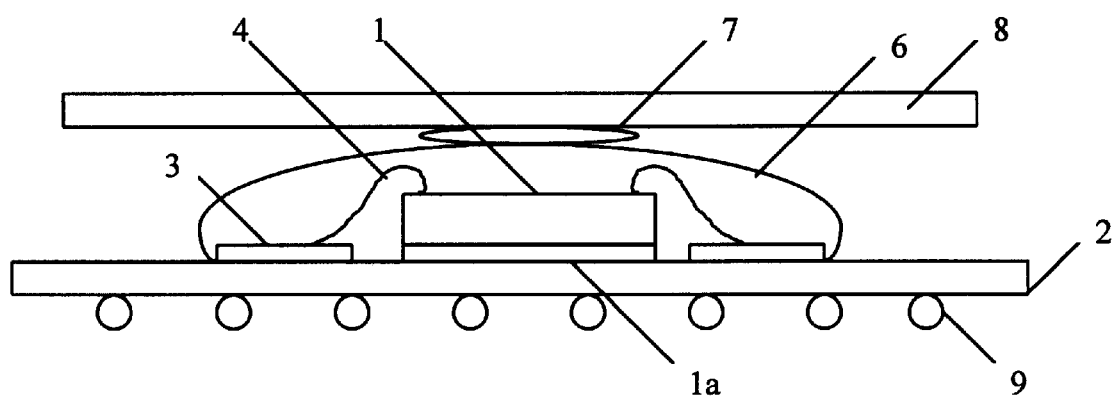
FIG. 1 is a side view of a glob top package with a lid attached by an epoxy.
Figure 3A:
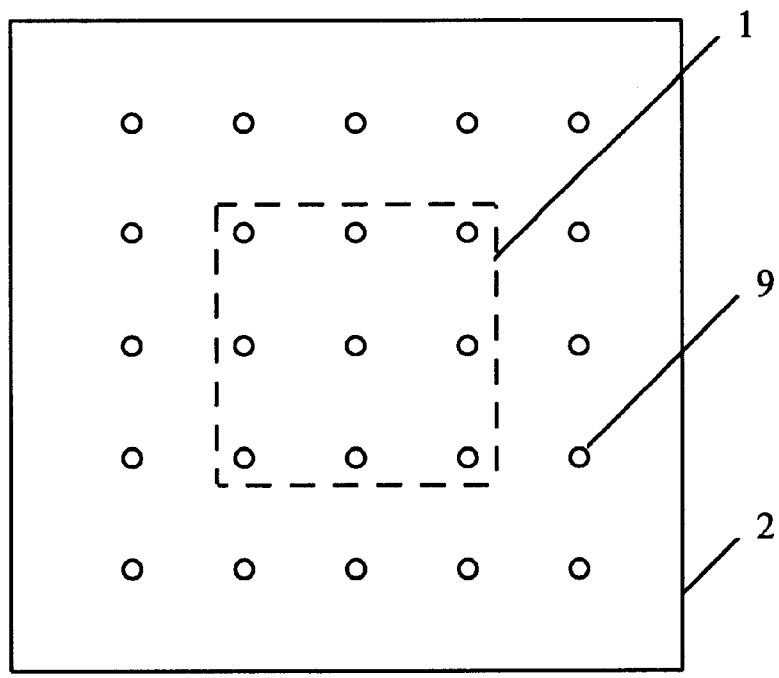
FIG. 3A is a bottom view of a semiconductor chip package having a die attached to the top surface and second level interconnects on the bottom surface.
Figure 3B:
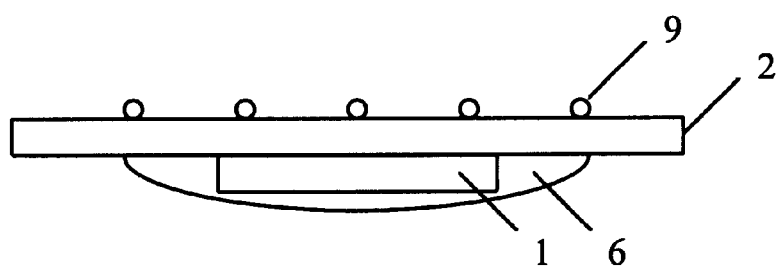
FIG. 3B is a side view of the glob top package shown in FIG. 3A.
Figure 3C:
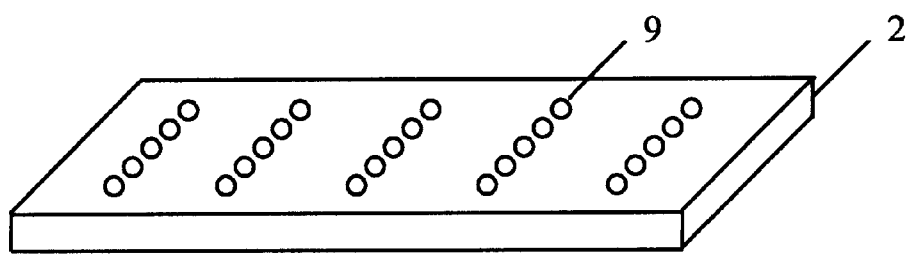
FIG. 3C is a perspective view of the glob top package shown in FIGS. 3A and 3B.

An encapsulated package is shown in FIGS. 3A through 3C. The package comprises a substrate 2 with an attached die 1 and second level interconnects 9. The die 1 is covered with encapsulant 6. Notice this package is oriented up-side-down from the package shown in FIG. 1. Further, the first level interconnects and traces are not shown. In this particular embodiment, the second level interconnects are solder balls. This type of package is typically referred to as a ball grid array ("BGA") package.

Figure 4A:
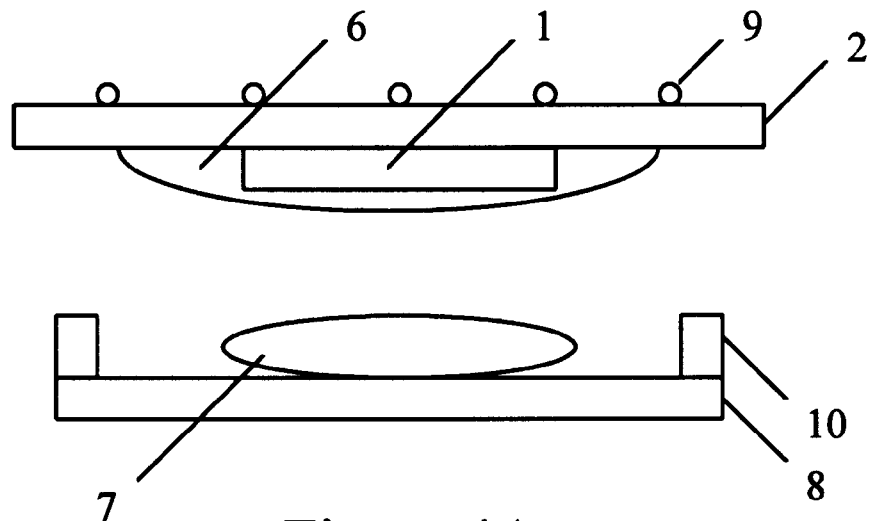
FIG. 4A is a side view of the glob top package and lid prior to assembly.
Figure 4B:
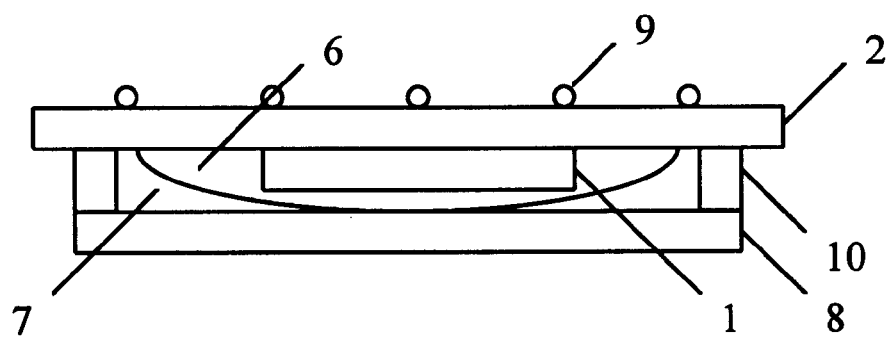
FIG. 4B is a side view of the glob top package with the assembled lid.

Referring to FIGS. 4A and 4B, the package and lid are shown before and after lid attachment, respectively. Before attachment, epoxy 7 is placed in a central location on the surface of the lid 8 between the lid supports 10. As shown in FIG. 4B, the lid 8 is attached to the package by positioning the glob top of the package between the supports 10 of the lid 8. Because the encapsulant 6 of the glob top has a dome shape, the epoxy 7 is squeezed from a central location on the lid 8 toward the periphery of the lid. The epoxy 7 occupies the space between the substrate 2 and the lid 8 which is not occupied by the encapsulant 6. The lid supports 10 rest firmly on the substrate of the package to prevent the lid from tilting to one side or the other so that a good conduction path between the die and the lid is created.

In an alternative embodiment, the lid supports are removable from the lid. Thus, the lid supports are placed between the lid and the substrate while the package is cured and the epoxy becomes solid. After the lid is firmly attached and the package is cured, the lid supports are removed from between the lid and the substrate. They are pulled sideways from between the members.

A suitable encapsulant for the glob top is found in an epoxy, such as Hysol FP4450, produced by Dexter Corp. The lid is attached to the glob top package with thermally conductive adhesive or epoxy, such as "LOCTITE-384" produced by Loctite Corp.

Figure 5A:
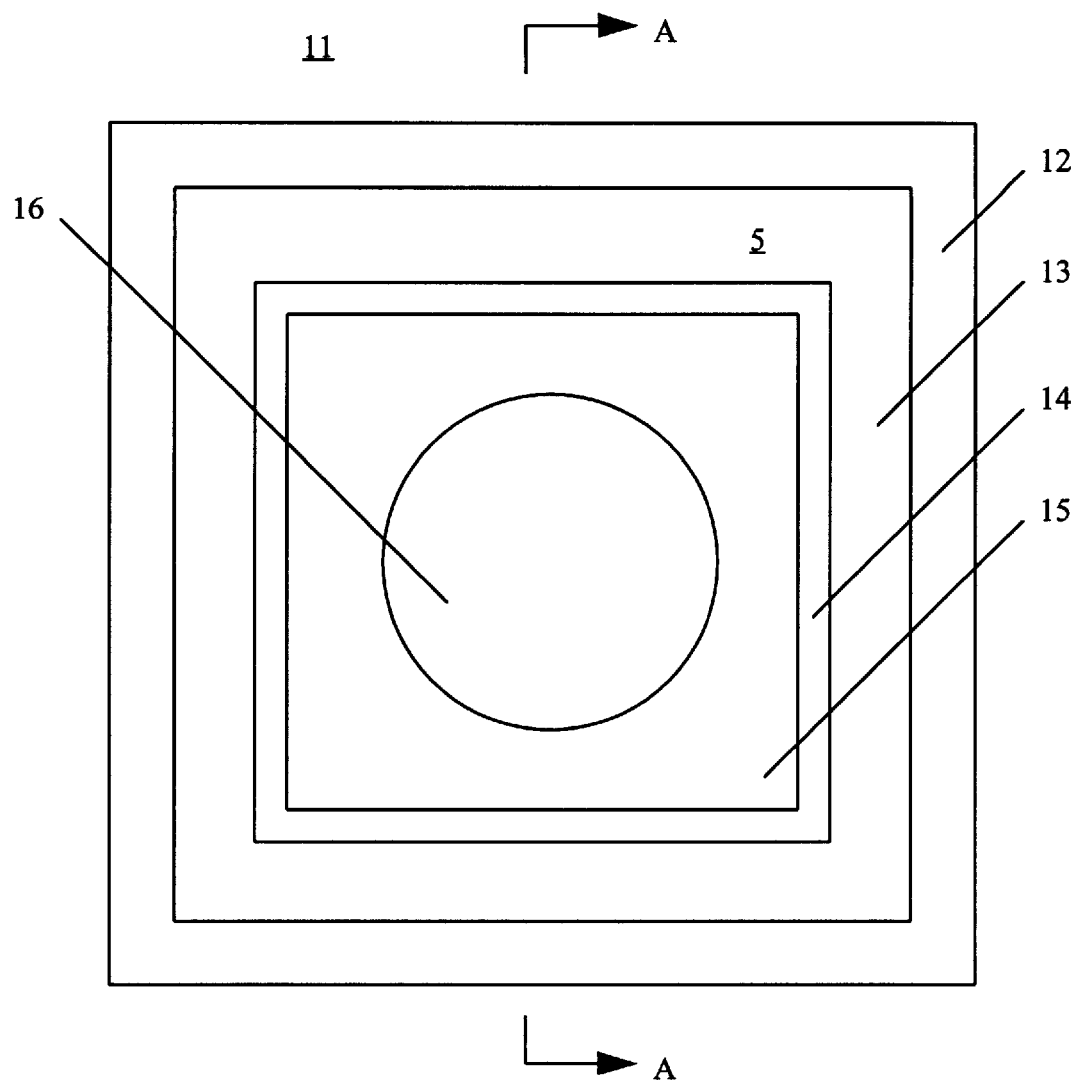
FIG. 5A is a top view of a fixture for attaching and curing the lid and glob top package.
Figure 5B:
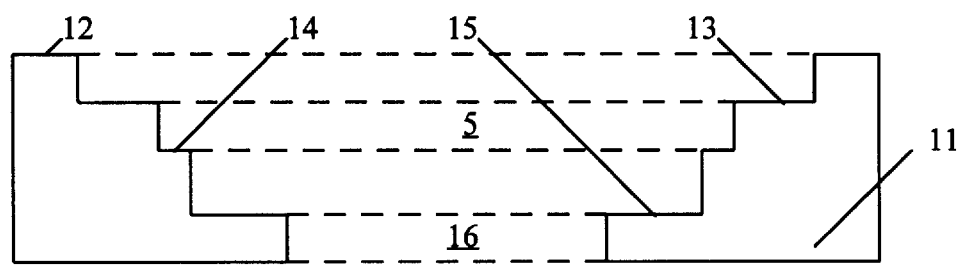
FIG. 5B is a cross sectional side view of the fixture shown in Figure 5A across line A—A.

Referring to FIGS. 5A and 5B, there is shown a fixture 11 for attaching the lid to the package according to an embodiment of the invention. In this embodiment, the fixture 11 is a rectangular plate with a stairstepped or recessed interior opening 5 for receiving a package lid and package substrate. In particular, as seen in the cross-sectional view of FIG. 5B, below the top surface 12 of the fixture 11, the first step or recess is a top plate plane 13 which has a shape and outside dimension corresponding to a top plate described more fully below. The next step or recess is a substrate plane 14 which has a shape and dimension corresponding to the substrate 2 and the final step or recess is a lid seating plane 15 which has a shape and dimension corresponding to the lid. A punch out hole 16 is formed in the center of the lid seating plane 15 to facilitate removal of the assembled package.

Figure 6A:
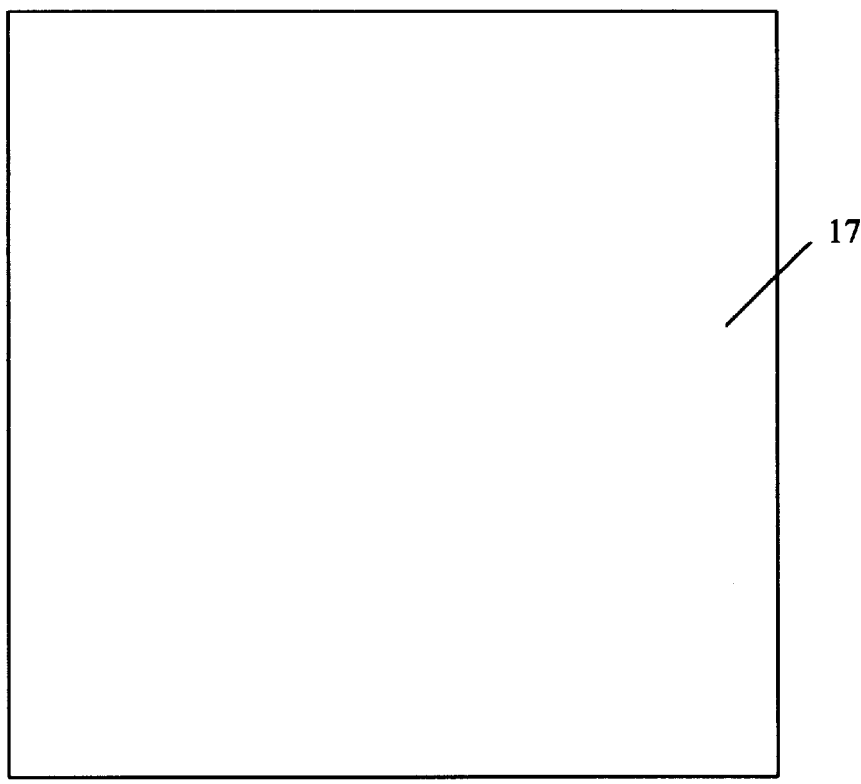
FIG. 6A is a top view of a top plate for the fixture.
Figure 6B:
FIG. 6B is a side view of the top plate shown in FIG. 6A.
Figure 6C:
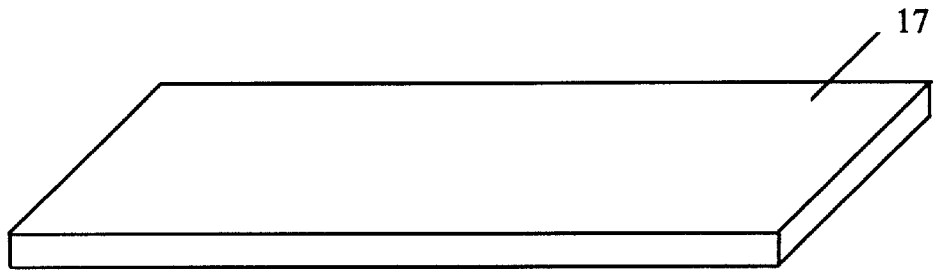
FIG. 6C is a perspective view of the top plate shown in FIGS. 6A and 6B.

FIGS. 6A through 6C, show a top plate 17 for use with the fixture. The top plate 17 is rectangularly shaped for placement within the fixture 11 on the top plate plane 13 and operates to hold the package and lid in place during assembly and curing processes.

Figure 7:
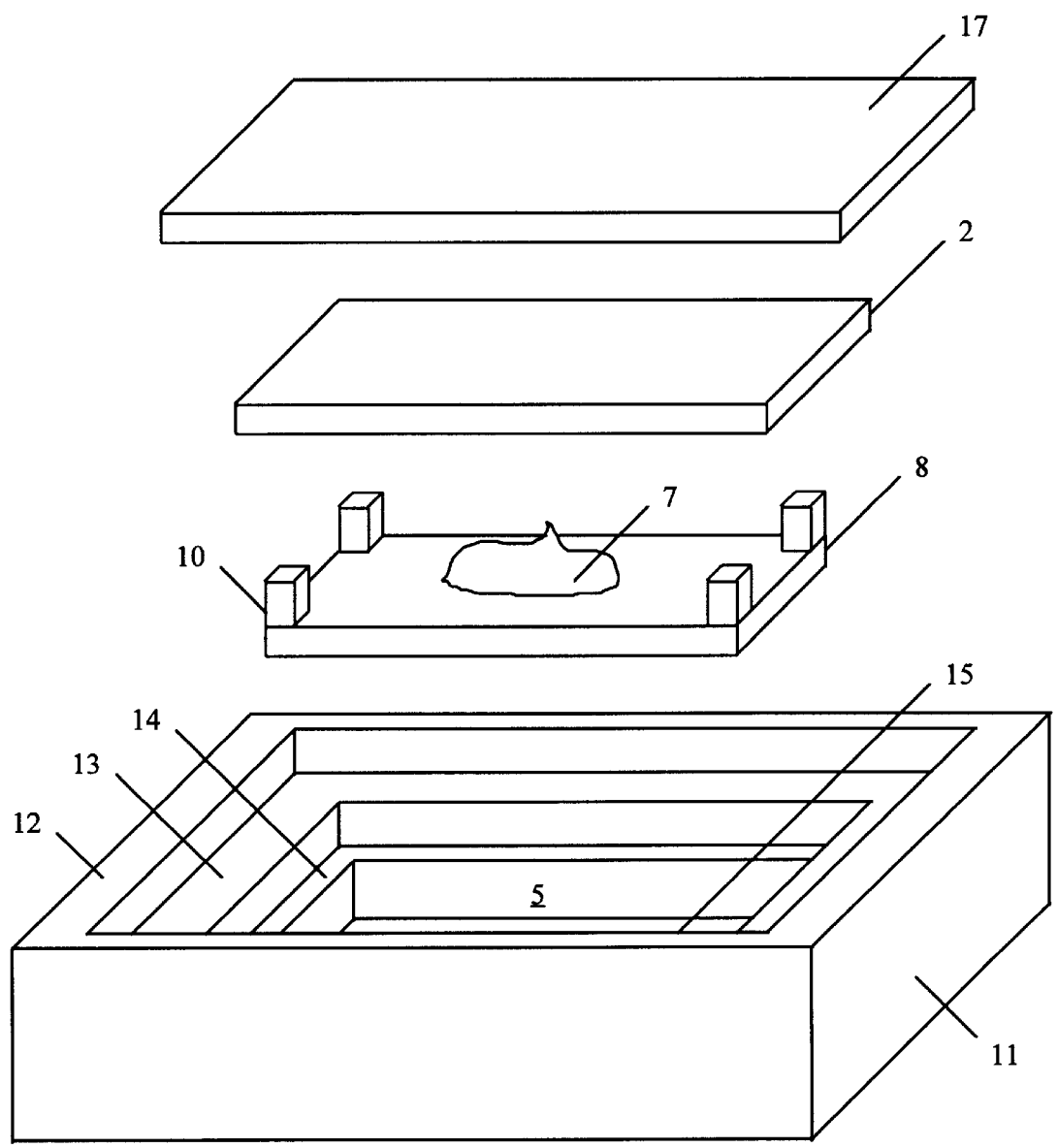
FIG. 7 is a perspective view of a fixture, lid, glob top package, and top plate prior to assembly.

FIG. 7 is an exploded diagram showing a perspective view of a lid 8, a BGA package with substrate 2 and a top plate 17 for placement in a fixture 11. The lid 8 is placed within the fixture 11 with the lid supports 10 pointing upward. Further, epoxy 7 is placed on the center of the lid 8. Any standard dispenser is used to deposit the epoxy, such as an Asymetek Millennium XYZ Table dispenser. The lid 8 is lowered into the fixture 11 until the lid rests on the lid seating plane 15. The package with substrate 2 is then placed within the fixture 11 with the die pointing toward the fixture 11 and the solder ball pads for second level connection pointing upward. The package with substrate 2 is lowered until the encapsulant glob top contacts the epoxy 7 on the lid 8. Finally, the top plate 17 is placed in the fixture 11 and lowered until it rests upon the bottom surface of the package to hold the package and lid in place during an epoxy curing process.

Figure 8:
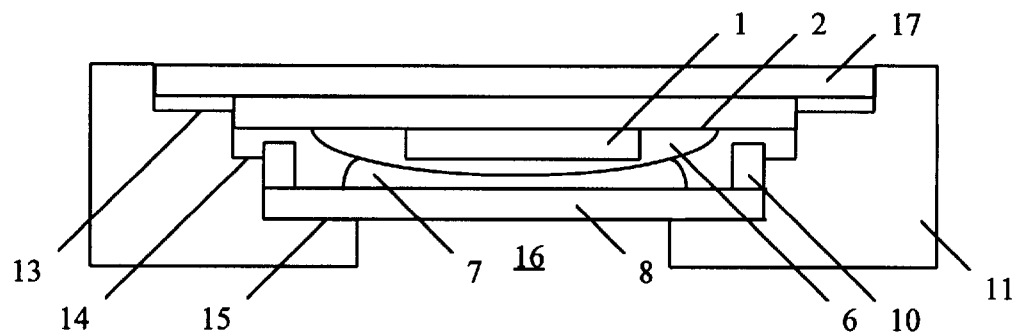
FIG. 8 is a cross-sectional side view of a fixture with a lid, glob top package, and top plate inserted into a fixture.

As shown in FIG. 8, the lid 8 rests firmly on the lid seating plane 15 and spans the punch out hole 16 of the fixture 11. The glob top of the package extends downwardly between the lid supports 10 of the lid 8. The substrate 2, however, does not rest firmly on the substrate plane 14. Rather, the package is supported initially by the viscous epoxy 7 which contacts the encapsulant 6 of the glob top package. The top plate 17 is supported by the bottom surface of the package substrate. A clamp is now used to force the package to rest on the lid supports 10 as will be described in greater detail with respect to FIG. 9.

Figure 9:
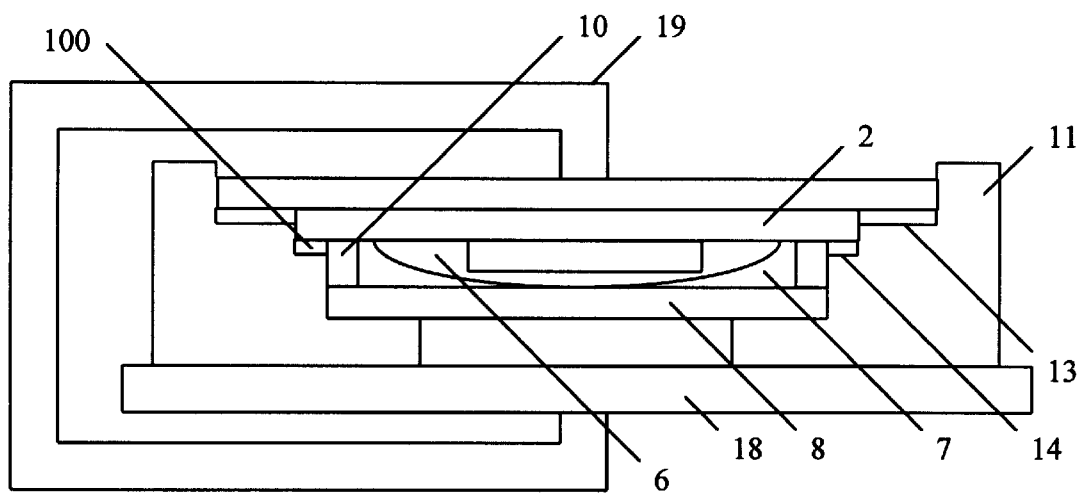
FIG. 9 is a cross-sectional side view of the package and lid of FIG. 8 being squeezed in the fixture with a clamp.

As shown in FIG. 9, the fixture 11 is placed on a Auer boat 18 for the final assembly and curing process. Use of the Auer boat facilitates automation of the assembly operation, allowing multiple devices to be assembled simultaneously, but is not critical to the present invention. A clamp 19 is placed around the fixture 11 so that the ends of the clamp 19 engage the top plate 17 and the Auer boat 18. The top plate 17 protects the package traces from damage by the clamp 19 and distributes the force of the clamp evenly over the package. The clamp 19 exerts a sufficient force on the top plate to compress the package assembly until the substrate 2 firmly rests against the lid supports 10. Because the lid supports 10 extend upwardly above the substrate plane 14, a small gap 100 is created between the substrate 2 and the substrate plane 14. Similarly, in this embodiment, the top plate 17 does not rest firmly on the top plate plane 13. Rather, a small gap is created between the top plate 17 and the top plate plane 13. The package is forced into the fixture by the force of the clamp and the epoxy 7 is "squeezed" by the encapsulant 6 of the glob top away from the center of the lid 8. The epoxy 7 fills all of the space between the encapsulant 6 and the lid 8 and pours over into the gap 100 between the substrate 2 and the substrate seating plane 14. The gap 100 allows the epoxy to completely surround the lid supports because, the epoxy flows around the lid supports 10 where the lid supports 10 contact the substrate 2 of the package. This provides a solid attachment of the lid to the package.

With the clamp 19 attached, the package is ready for curing in an oven. Once cured, the package is removed from the oven and the clamp 19 is detached from the fixture 11. The fixture 11 is also removed from the Auer boat 18 to expose the punch out hole 16 of the fixture 11. The package is then removed from the fixture 11 by inserting a device into the punch out hole 16 to push against the lid 8 until the entire package becomes free from the fixture 11. In some embodiments, the fixture 11 is coated with a non-stick material, such as, nickel-teflon plating, or sprayed with mold release material, which ensures the lid and package are easily removable from the fixture.

Figure 10:
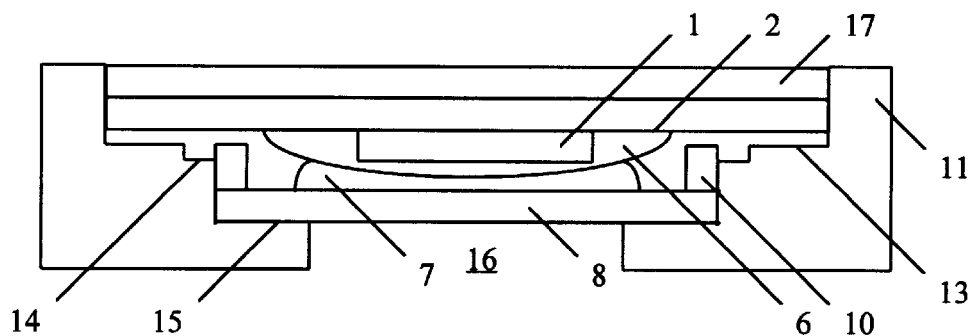
FIG. 10 is a cross-sectional side view of an alternative fixture with a lid, glob top package, and top plate inserted into a fixture.
Figure 11:
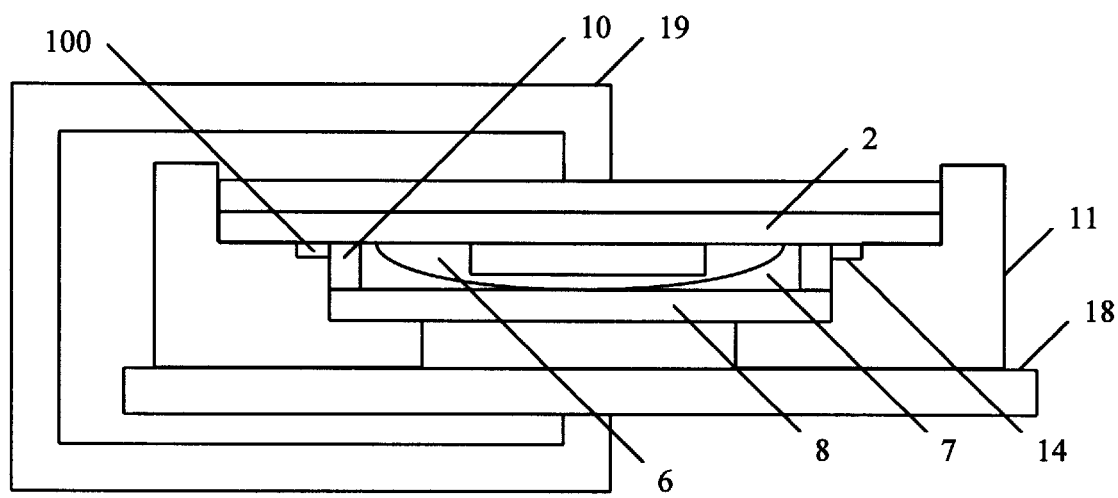
FIG. 11 is a cross-sectional side view of the package and lid of FIG. 10 being squeezed in the fixture with a clamp.

Referring to FIGS. 10 and 11, an alternative embodiment of the fixture is shown. The lid 8 rests firmly on the lid seating plane 15 and spans the punch out hole 16 of the fixture 11. The glob top of the package extends downwardly between the lid supports 10 of the lid 8. Unlike the prior embodiment, the substrate 2 of the package is wider than the substrate plane 14 and does not fit into the second step or recess of the interior opening 5. Rather, the substrate 2 perimeter corresponds to the dimensions of the first step or recess and the top plate plane 13. The package is supported initially by the viscous epoxy 7 which contacts the encapsulant 6 of the glob top package. The top plate 17 is supported by the bottom surface of the package substrate. A clamp forces the package to rest on the lid supports 10 as shown in FIG. 11. A gap 100 is formed between the substrate plane 14 and the substrate 2 of the package which receives overflow epoxy 7.

Figure 12A:
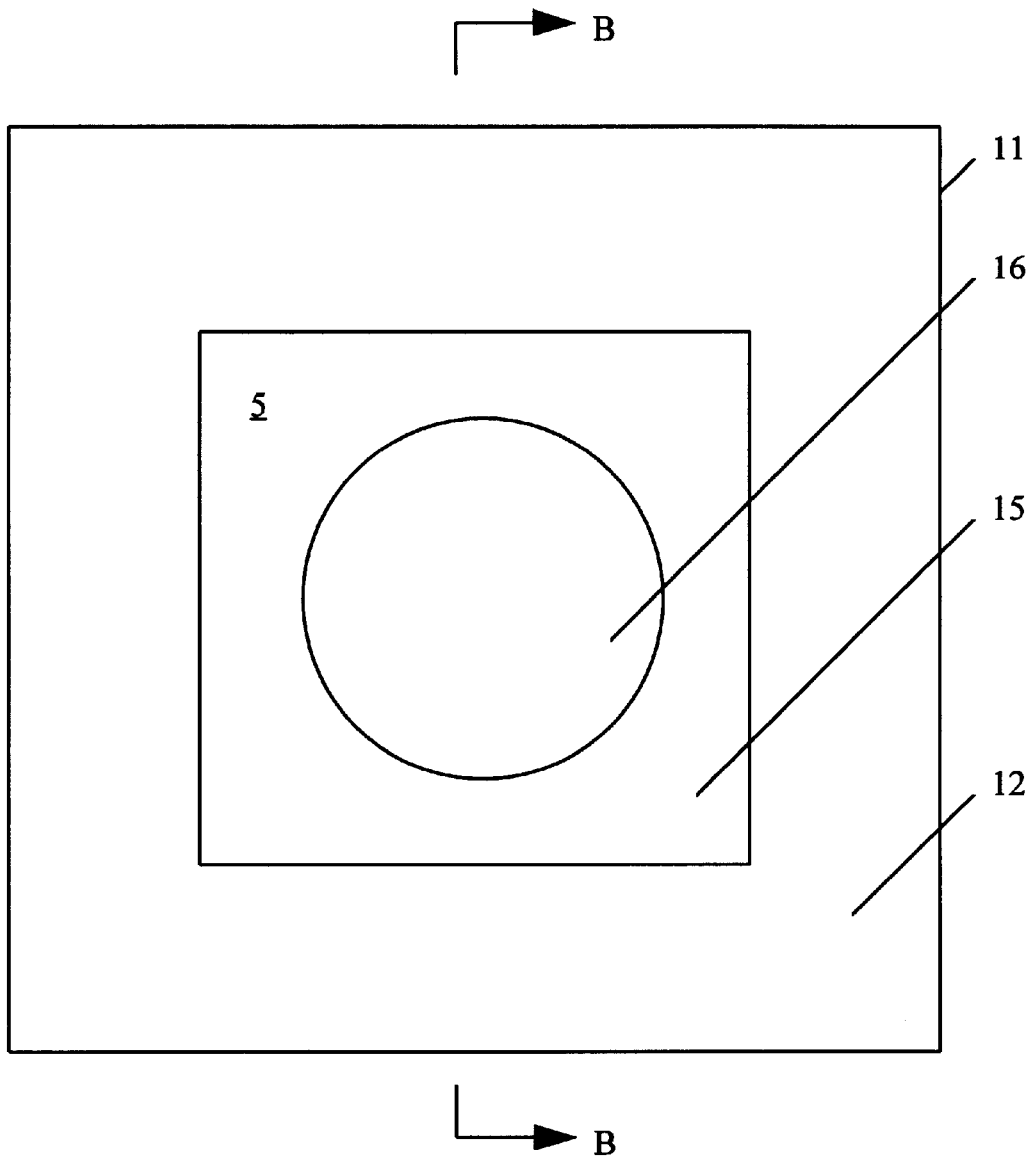
FIG. 12A is a top view of an alternative fixture.
Figure 12B:
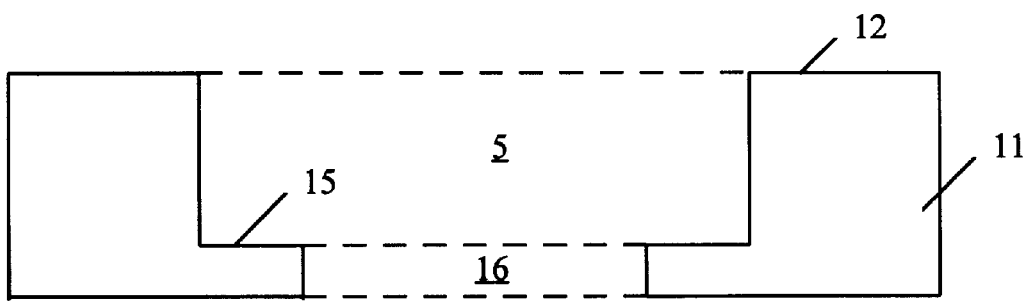
FIG. 12B is a cross-sectional side view of the fixture shown in FIG. 12A across line B—B.

Referring to FIGS. 12A and 12B, an alternative fixture 11 is shown. This embodiment of the fixture 11 only comprises a lid seating plane 15 below the top surface 12 of the fixture 11. However, similar to the prior embodiments, the fixture 11 comprises a punch out hole 16 and an overall rectangular configuration. This embodiment is used for packages wherein the lid and substrate have similar outside dimensions.

Figure 13:
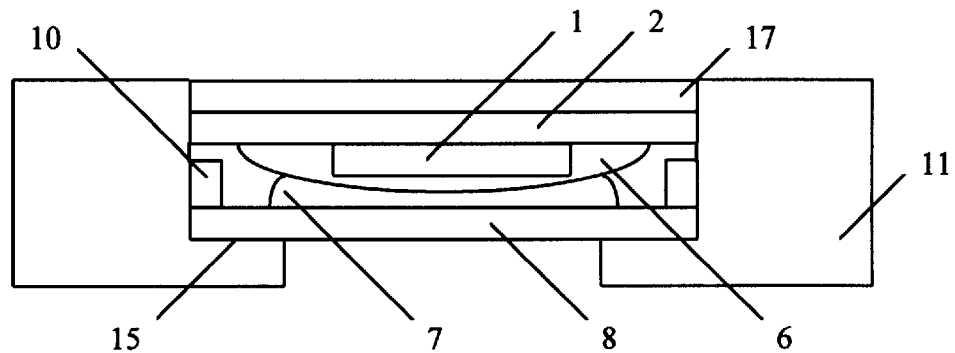
FIG. 13 is a cross-sectional side view of a fixture with a lid, glob top package, and top plate inserted into the fixture of FIGS. 12A and 12B.

As shown in FIG. 13, a lid 8 is positioned in the bottom of the fixture 11 on the lid seating plane 15 with lid supports 10 pointing upward. A drop of epoxy 7 is placed in the center of the lid 8 between the lid supports 10. A glob top package is placed on top of the lid 8 with the glob top pointing downward and a top plate 17 is positioned on the bottom surface of the package substrate.

Figure 14:
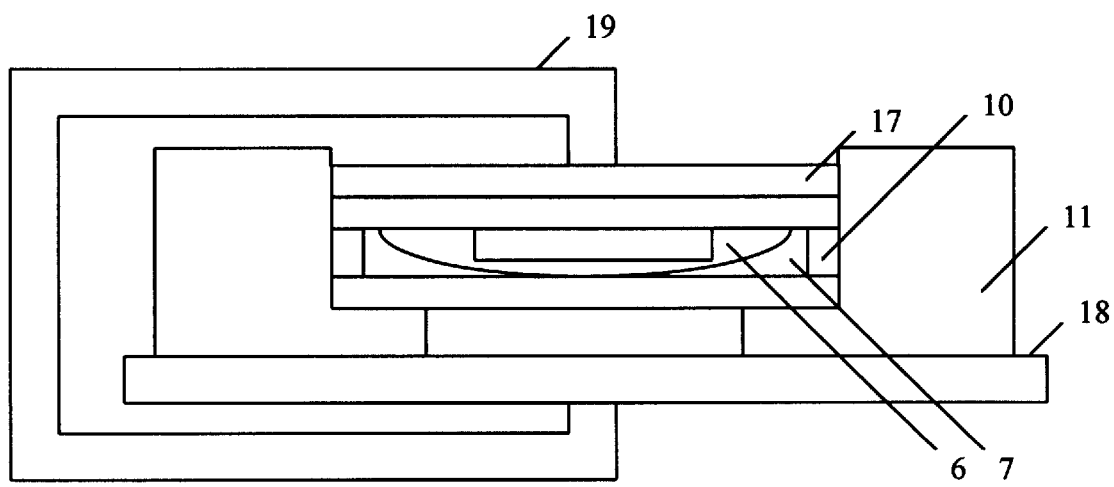
FIG. 14 is a cross-sectional side view of the lid and package of FIG. 13 being squeezed in the fixture by a clamp.

As shown in FIG. 14, the fixture 11 is again placed on an Auer boat 18 and a clamp 19 is fastened to the Auer boat 18 and the top plate 17. The clamp 19 squeezes the package and the fixture 11 until the substrate 2 rests firmly upon the lid supports 10. The epoxy 7 is squeezed from the central portion of the package toward the periphery where it fills the space between the substrate 2 and the lid 8. As before, the package is removed from the fixture 11 by disengaging the clamp 19 and punching the package from the fixture 11 through the punch out hole 16.

Figure 15A:
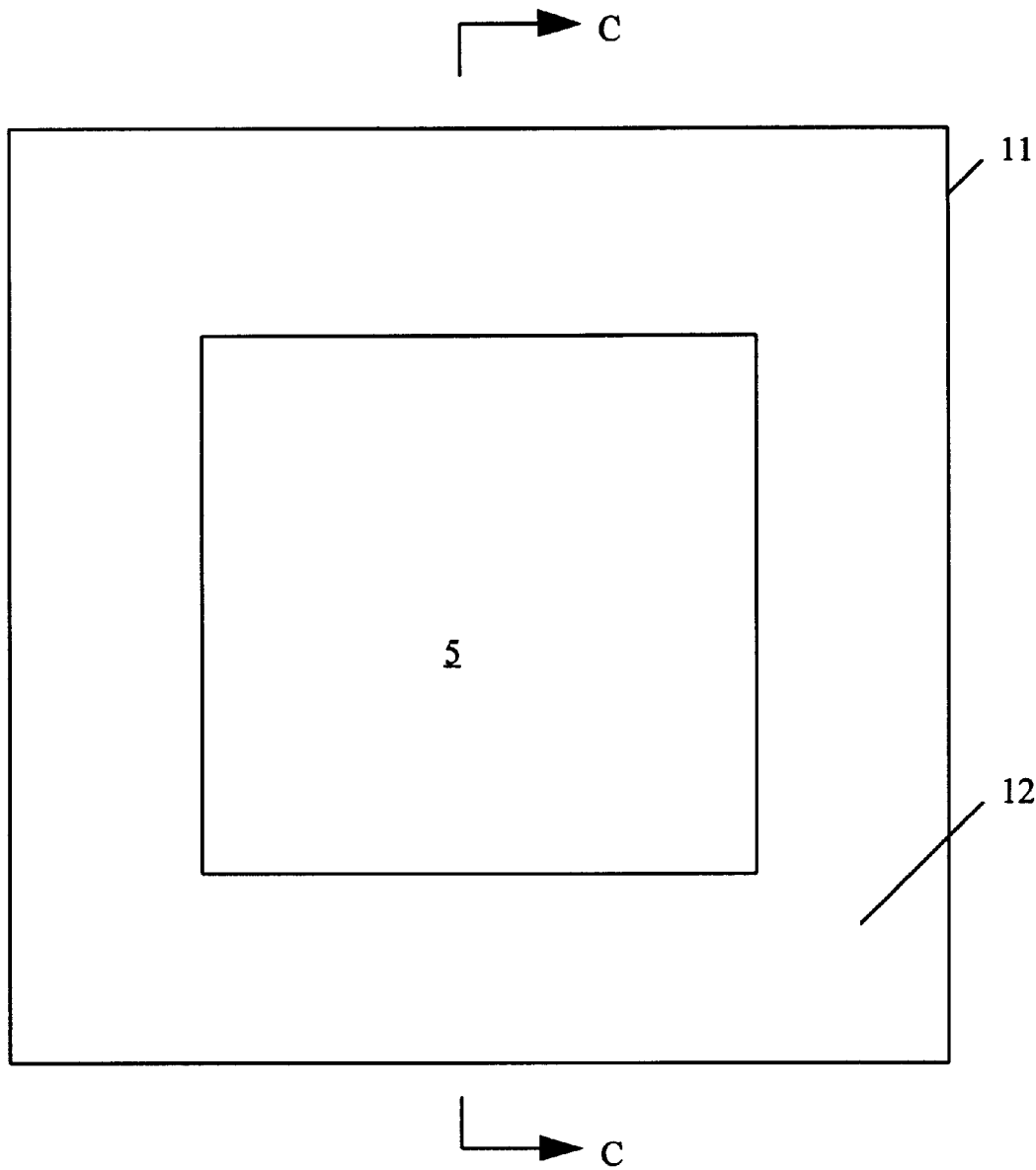
FIG. 15A is a top view of still another embodiment of a fixture.
Figure 15B:
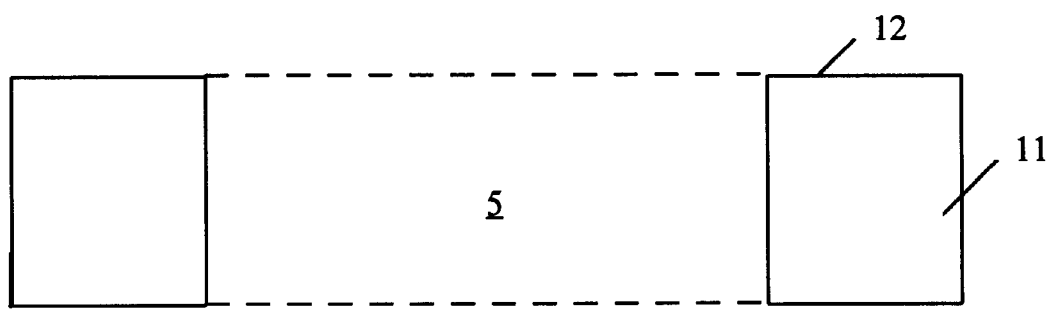
FIG. 15B is a cross-sectional side view of the fixture shown in FIG. 15A across line C—C.
Figure 16:
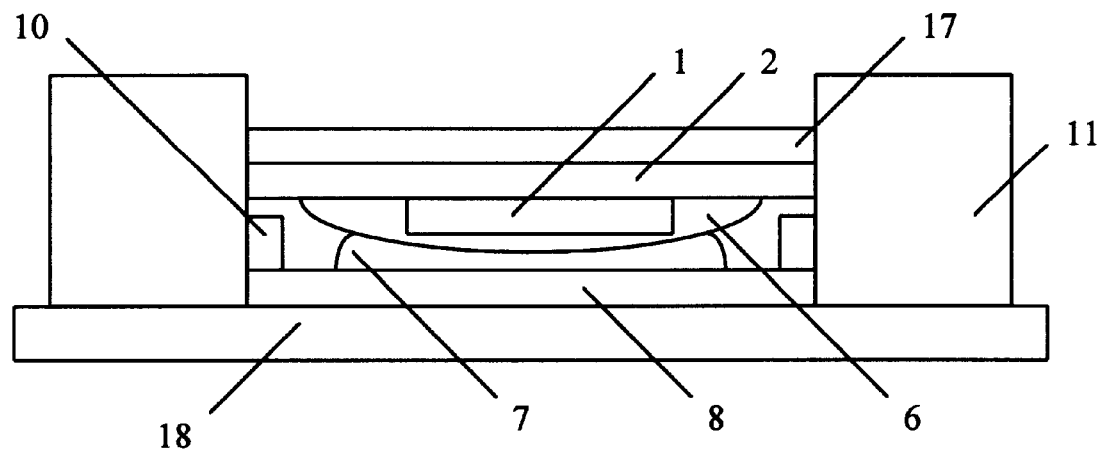
FIG. 16 is a cross-sectional side view of a lid, package, and top plate in the fixture of FIGS. 15A and 15B with the lid on the bottom and the package on the top.

A still further embodiment of the fixture is shown in FIGS. 15A and 15B. This particular fixture 11 comprises a top surface 12 and an interior opening 5 and is rectangularly shaped, similar to the previously discussed fixtures, but does not comprise a lid seating plane. Rather, as shown in FIG. 16, the fixture 11 is placed on an Auer boat 18, and the upper surface of the Auer boat 18 functions as the lid seating plane. The lid 8 is placed in the interior opening 5 of the fixture with the lid supports 10 pointing upwardly. The lid is lowered in the opening 5 until the lid rests upon the Auer boat 18 at the bottom of the opening 5. The package and top plate are then placed in the opening 5 as before after epoxy dispensing on the lid.

Figure 17:
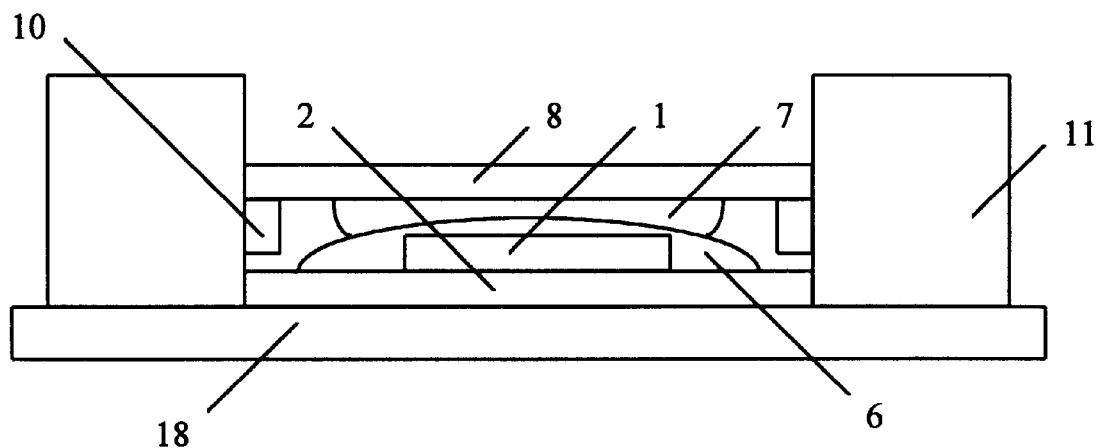
FIG. 17 is a cross-sectional side view of a lid and package in the fixture of FIGS. 15A and 15B with the package on the bottom and the lid on the top.

Referring to FIG. 17, a description of an alternative method of using the fixture shown in FIGS. 15A and 15B is provided. Because the upper surface of the Auer boat 18 functions as the lid seating plane, it does not matter whether the package or the lid is placed in the opening of the fixture first. Thus, as shown the package is first placed in the opening of the fixture with the glob top pointing upwardly. A drop of epoxy 7 is placed on the glob top and the lid 8 is placed in the opening of the fixture with the lid supports 10 pointing downwardly.

Figure 18:
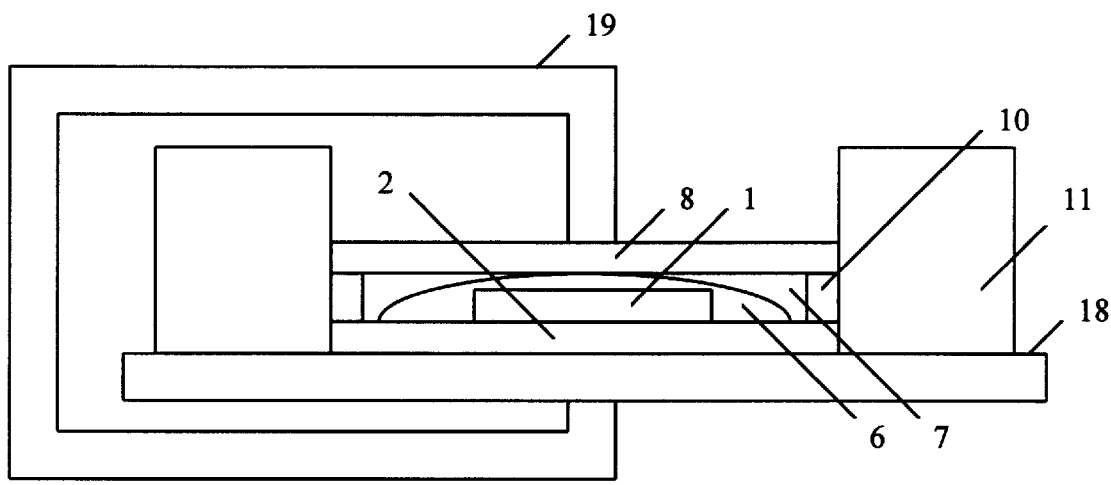
FIG. 18 is a cross-sectional side view of a lid and package being squeezed in the fixture of FIGS. 15A and 15B by a clamp.

Referring to FIG. 18, a clamp is added to the fixture shown in FIG. 17. Because the lid 8 is now on top of the package and the package bottom surface is uniformly supported by the Auer boar 18, it is not necessary to place a top plate in the opening. A clamp 19 is placed around the fixture to engage the Auer boat 18 and the lid 8 to squeeze the lid and package together. Once cured, the package with the attached lid is removed from the fixture by removing the clamp, disengaging the fixture from the Auer boat and pushing the package from the lid side out the bottom of the fixture. Of course, the package may also be pushed from the substrate side out the top of the fixture, but care must be taken not to damage the traces on the bottom of the substrate.

Figure 19:
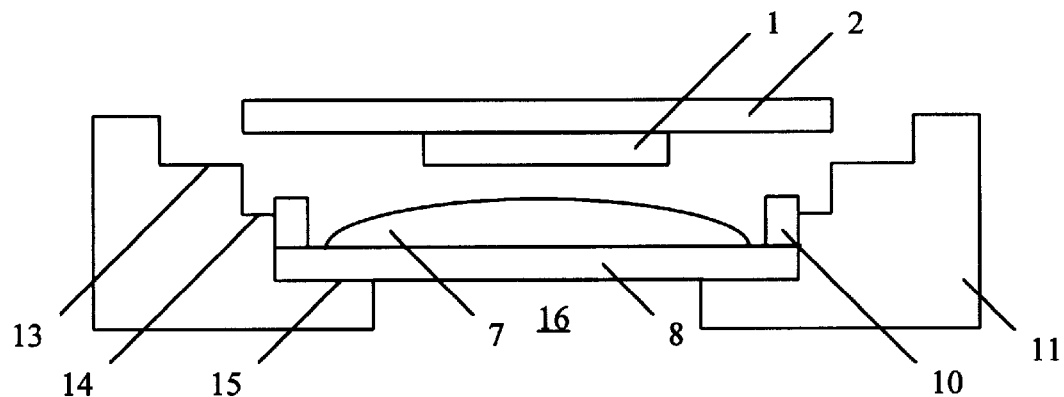
FIG. 19 is a cross-sectional side view of a lid and a non-encapsulated package being inserted into a fixture for attachment.
Figure 20:
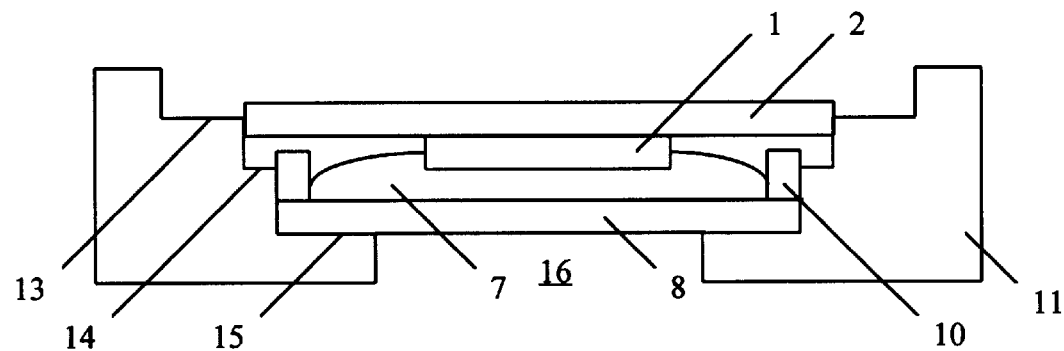
FIG. 20 is a cross-sectional side view of a lid and a non-encapsulated package of FIG. 19, wherein epoxy is beginning to surround the die of the package.
Figure 21:
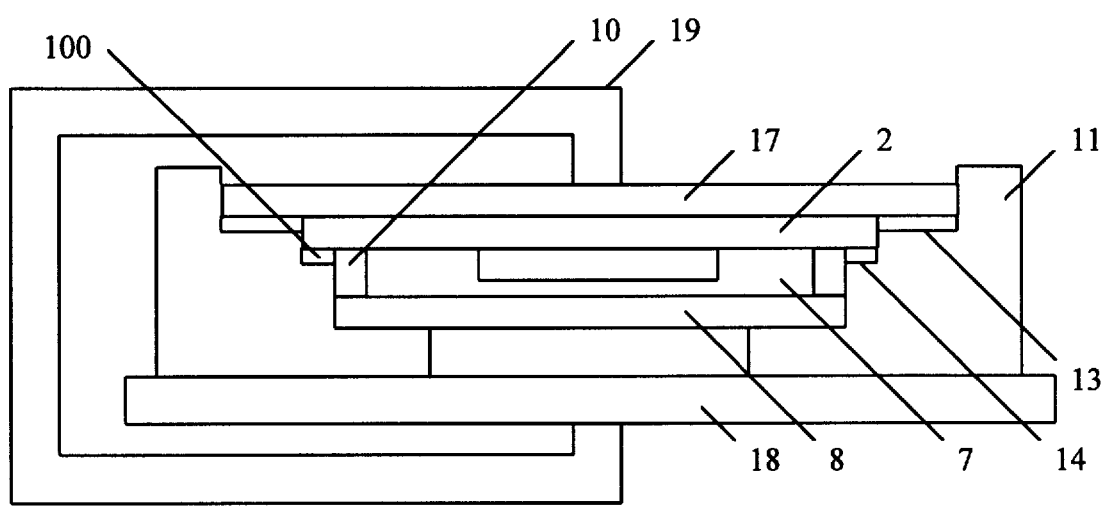
FIG. 21 is a cross-sectional side view of the lid and package of FIGS. 19 and 20 being squeezed in the fixture by a clamp.

Referring to FIG. 19, an embodiment of the invention is shown for attaching a lid to a non-encapsulated package. In this embodiment, the package comprises a substrate 2 and die 1, but does not have a glob-top dome of encapsulant over the die 1. A lid 8 is lowered into the interior opening of the fixture 11 with the lid supports 10 pointing upward. Epoxy 7 is dispensed on the lid 8 between the lid supports 10. The package is then inserted into the interior opening of the fixture with the die 1 facing the lid 8. As shown in FIG. 20, the package is lowered until the die 1 contacts the epoxy 7. As shown in FIG. 21, a top plate 17 is then placed on top of the substrate 2 of the package to protect the package traces and a clamp 19 is secured to the top plate 17 and the Auer boat 18. As the clamp 19 compresses the lid and the package, the epoxy 7 moves between the wire bonds, not shown, and surrounds the die 1 of the package. The epoxy 7 also spills into the gap 100 between the substrate plane 14 and the substrate 2. In this embodiment, the epoxy 7 functions, not only as the means of attaching the lid to the package, but also performs the function of the glob top encapsulant discussed above relative to other embodiments of the invention.

In alternative embodiments, the number and sizes of steps within the fixture correspond to the package and lid to be attached. In a particular alternative embodiment, two opposite sides of the interior opening do not have steps, while the adjacent sides do have steps. This fixture is used to attach lids and packages where the dimension of the package substrates are greater in one direction but exactly the same in the other direction.

A variety of clamps are useable with the disclosed fixtures including clamps which have adjustable pressure points. Once attached to the fixture and the top plate, the clamp is adjusted to impart the desired pressure on the lid and package.

In alternative embodiments, more than one fixture is attached to an Auer boat so that multiple packages are processed simultaneously. The Auer boat may be adapted to operate with a conveyor system for processing packages continuously.

In all embodiments of the invention, depending on the particular application, a precise amount of epoxy is deposited on the lid prior to attachment to the package. For example, in some applications it is not desirable for the epoxy to fill the entire space between the package and the lid. For these embodiments, a smaller drop of epoxy is placed at the center of the lid.

While the particular embodiments for methods and apparatuses for attaching lids to electronic semiconductor device packages as herein shown and disclosed in detail are fully capable of obtaining the objects and advantages herein before stated, it is to be understood that they are merely illustrative of the presently preferred embodiments of the invention and that no limitations are intended by the details of construction or design herein shown other than as described in the appended claims.

What is claimed is:

1. A method of attaching a lid to an electronic semiconductor device package, the package comprising:
   a substrate having a top surface and a bottom surface and having traces,
   a die attached to the top surface of said substrate,
   first level interconnects of said die to the traces of said substrate, and the method comprising:
   inserting a lid into a fixture, wherein said fixture comprises an interior opening for receiving the lid and package wherein the interior opening has a first wall corresponding to a dimension of the substrate and a second wall corresponding to a dimension of the lid;
   applying adhesive between the lid and package; and
   inserting a package into the fixture.

2. A method as in claim 1, wherein said inserting a lid is before said inserting a package.

3. A method as in claim 1, further comprising inserting a top plate, which protects the lid and package, into the interior opening of the fixture.

4. A method as in claim 1, further comprising squeezing the lid and package within the fixture.

5. A method as in claim 1, further comprising curing an epoxy of the lid applied to the package top surface within the fixture.

6. A method of attaching a lid to an electronic semiconductor device package, the package comprising a substrate having a top surface and a bottom surface, and a die attached to the top surface of said substrate, the method comprising the steps of:

provi ding a fixture comprising:

a first wall defining a first opening, the first wall dimensioned to receive the substrate, the first wall having a top;

a second wall within the first opening, the second wall dimensioned to receive the lid, the second wall having a top that is lower than the top of the first wall, the second wall defining a second opening;

a third wall within the second opening, the third wall having a top that is lower than the top of the second wall;

inserting the lid into the second opening such that the lid is supported at least in part by the top of the third wall;

applying adhesive between the lid and the substrate;

inserting the substrate into the first opening such that the adhesive contacts both the lid and the substrate, thereby attaching the lid to the substrate to create an assembled package; and removing the assembled package from the fixture.

* * * * *